(12) United States Patent
Isobe et al.

(10) Patent No.: US 11,251,298 B2
(45) Date of Patent: Feb. 15, 2022

(54) POWER SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Yasuhiro Isobe, Ota (JP); Hung Hung, Kawasaki (JP); Masaaki Onomura, Setagaya (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/801,013

(22) Filed: Feb. 25, 2020

(65) Prior Publication Data

US 2021/0083102 A1 Mar. 18, 2021

(30) Foreign Application Priority Data

Sep. 18, 2019 (JP) .............................. JP2019-169779

(51) Int. Cl.
*H01L 29/78* (2006.01)
*H01L 29/04* (2006.01)
(Continued)

(52) U.S. Cl.
CPC ........ *H01L 29/7813* (2013.01); *H01L 29/045* (2013.01); *H01L 29/2003* (2013.01); *H01L 29/4236* (2013.01); *H01L 29/4238* (2013.01)

(58) Field of Classification Search
CPC ............... H01L 29/7813; H01L 29/045; H01L 29/2003; H01L 29/4236; H01L 29/4238
See application file for complete search history.

(56) References Cited

U.S. PATENT DOCUMENTS

| 9,947,781 B2 * | 4/2018 | Minoura ........... H01L 29/66734 |
| 2018/0138322 A1 * | 5/2018 | Dun .................... H01L 29/7813 |

(Continued)

FOREIGN PATENT DOCUMENTS

| JP | 2001-102576 A | 4/2001 |
| JP | 5667926 B2 | 2/2015 |
| JP | 2017-50320 A | 3/2017 |

OTHER PUBLICATIONS

Toru Kaji, et al., "Development of elemental technologies for realizing Gallium nitride (GaN) power devices", Institute of Materials and Systems for Sustainability, Nagoya University, May 17, 2018, 10 pages (with English Translation).

*Primary Examiner* — Douglas W Owens
(74) *Attorney, Agent, or Firm* — Oblon, McClelland, Maier & Neustadt, L.L.P.

(57) ABSTRACT

A semiconductor device of an embodiment includes: a first nitride semiconductor layer of a first conductive type; a second nitride semiconductor layer which is the first conductive type and is provided on the first nitride semiconductor layer; a third nitride semiconductor layer which is a second conductive type and is provided on the second nitride semiconductor layer; a fourth nitride semiconductor layer which is the first conductive type and is provided on the third nitride semiconductor layer; and a first electrode provided in a trench provided in the second nitride semiconductor layer, the third nitride semiconductor layer, and the fourth nitride semiconductor layer, via a first insulating film.

11 Claims, 7 Drawing Sheets

(51) Int. Cl.
*H01L 29/20* (2006.01)
*H01L 29/423* (2006.01)

(56) References Cited

U.S. PATENT DOCUMENTS

2019/0097004 A1* 3/2019 Ina .......................... H01L 29/06
2019/0371889 A1* 12/2019 Narita ................. H01L 29/1095

* cited by examiner

POWER SEMICONDUCTOR DEVICE

CROSS-REFERENCE TO RELATED APPLICATION

This application is based upon and claims the benefit of priority from Japanese Patent Application No. 2019-169779, filed on Sep. 18, 2019, the entire contents of which are incorporated herein by reference.

FIELD

Embodiments described herein relate generally to a semiconductor device.

BACKGROUND

A power semiconductor device using a wide bandgap semiconductor has attracted attention. GaN is a semiconductor attracting attention, and a semiconductor device with high characteristics is required.

For GaN, horizontal HEMT devices are the mainstream, but vertical MOS-FET structures are attracting attention as with Si and SiC.

DETAILED DESCRIPTION

Figure 1:
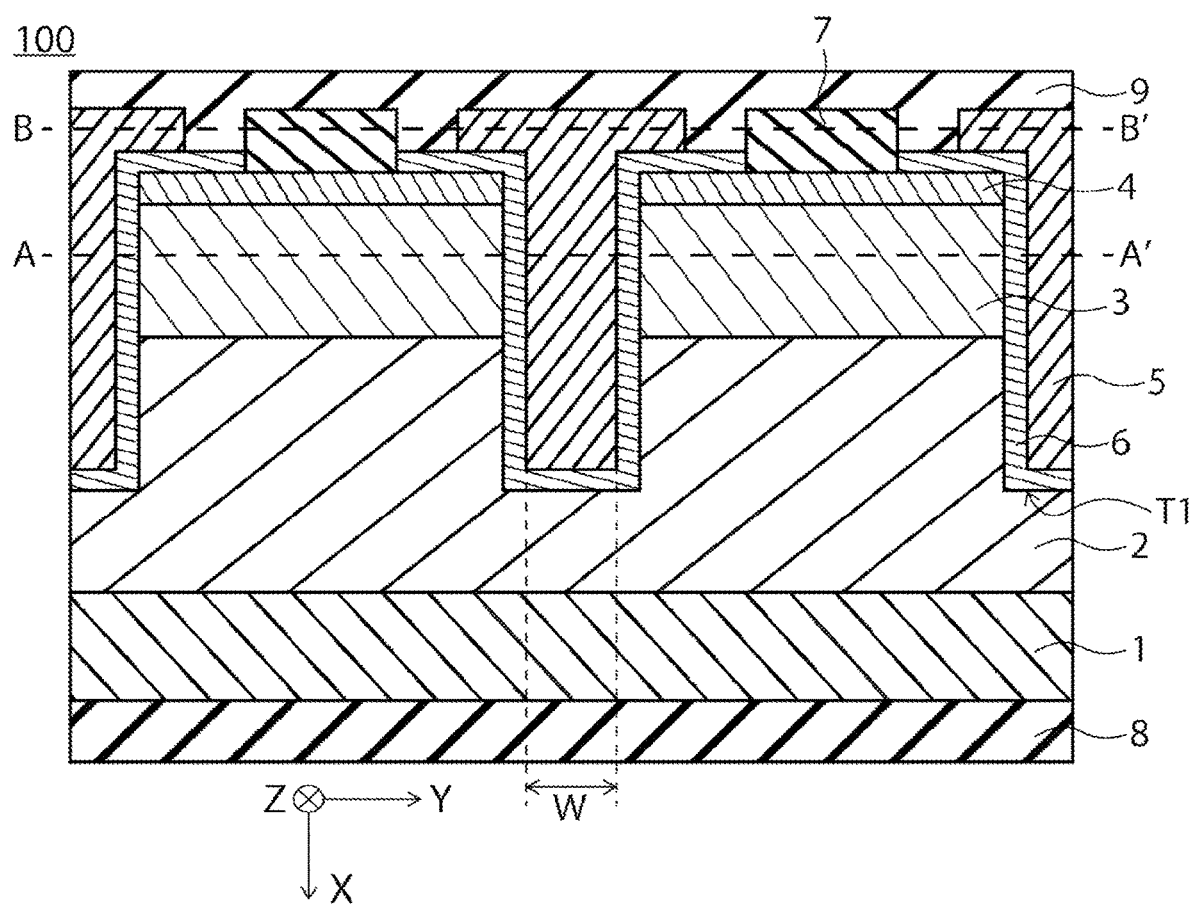
FIG. 1 is a sectional view illustrating a semiconductor device 100 in an embodiment.

A semiconductor device of an embodiment includes: a first nitride semiconductor layer of a first conductive type; a second nitride semiconductor layer which is the first conductive type and is provided on the first nitride semiconductor layer; a third nitride semiconductor layer which is a second conductive type and is provided on the second nitride semiconductor layer; a fourth nitride semiconductor layer which is the first conductive type and is provided on the third nitride semiconductor layer; and a first electrode provided in a trench provided in the second nitride semiconductor layer, the third nitride semiconductor layer, and the fourth nitride semiconductor layer, via a first insulating film. The third nitride semiconductor layer and the first electrode extend in a direction perpendicular to a direction in which the first nitride semiconductor layer and the second nitride semiconductor layer are stacked and are bent in zigzag.

Hereinafter, embodiments of the present disclosure will be described with reference to the drawings. In the drawings attached to this specification, for easy illustrations and understandings, the scale, the dimensional ratio of the length and the breadth, and the like are appropriately changed and exaggerated from those of the components in practice.

Hereinafter, the embodiments will be described with reference to the drawings. In the drawings, the same or similar parts are denoted by the same or similar reference signs.

In this specification, the same or similar members are denoted by the same reference signs and descriptions thereof may not be repeated.

In this specification, in order to indicate positional relations between the components and the like, the upward direction in the drawings is described as "upper", and a downward direction in the drawings is described as "lower". In this specification, "upper" and "lower" are not necessarily terms indicating the relationship with the direction of gravity.

Further, it is assumed that terms of, for example, "parallel", "orthogonal", "identical", and the like, which are used in this specification and are used for specifying the shape, geometrical conditions, and the degrees thereof, and values of the length, the angle, and the like are interpreted to include a range in which the similar function may be expected, without being bound by strict meanings.

In this specification, the expressions of n+, n, n−, p+, p, and p− indicate the relative degree of impurity concentration in each conductivity type. That is, n+ indicates the impurity concentration of an n-type impurity, which is relatively higher than the impurity concentration indicated by n. n− indicates the impurity concentration of the n-type impurity, which is relatively lower than the impurity concentration indicated by n. In addition, p+ indicates the impurity concentration of a p-type impurity, which is relatively higher than the impurity concentration indicated by p. p− indicates the impurity concentration of the p-type impurity, which is relatively lower than the impurity concentration indicated by p. n+, n, and n− may be simply described as the n-type, and p+, p, and p− may be simply described as the p-type.

In the following descriptions, descriptions will be made on the assumption that a first conductive type is the n-type, and a second conductive type is the p-type. The first conductive type may be the p-type, and the second conductive type may be the n-type. The embodiments are embodied even if the first conductive type is set to the p− type, and the second conductive type is set to the n-type.

First Embodiment

A first embodiment relates to a semiconductor device. FIG. 1 is a sectional view illustrating a semiconductor device 100 according to an embodiment. The sectional view of the semiconductor device 100 in FIG. 1 illustrates a portion of the semiconductor device 100.

A first direction X, a second direction Y, and a third direction Z intersect with each other. The first direction X, the second direction Y, and the third direction Z are preferably orthogonal to each other.

The semiconductor device 100 is a vertical MIS-FET, for example.

The semiconductor device 100 in FIG. 1 includes a first nitride semiconductor layer (drain layer) 1 of a first conductive type, a second nitride semiconductor layer (drift layer) 2 which is the first conductive type and is provided on the first nitride semiconductor layer 1, a third semiconductor layer (channel layer) 3 which is a second conductive type and is provided on the second nitride semiconductor layer 2, a fourth nitride semiconductor layer (source layer) 4 which is the first conductive type and is provided on the third nitride semiconductor layer 3, a first electrode (gate electrode) 5 provided in a trench T1 provided in the second nitride semiconductor layer, the third nitride semiconductor layer 3, and the fourth nitride semiconductor layer 4, via a first insulating film (gate insulating film) 6, a second electrode (source electrode) 7 provided on the fourth nitride semiconductor layer 4, a third electrode (drain electrode) 8 provided on an opposite side of a surface of the first nitride semiconductor layer 1, on which the second nitride semiconductor layer 2 is provided, and a second insulating film (interlayer insulating film) 9 provided on the first electrode 5 and the second electrode 7.

Figure 2:
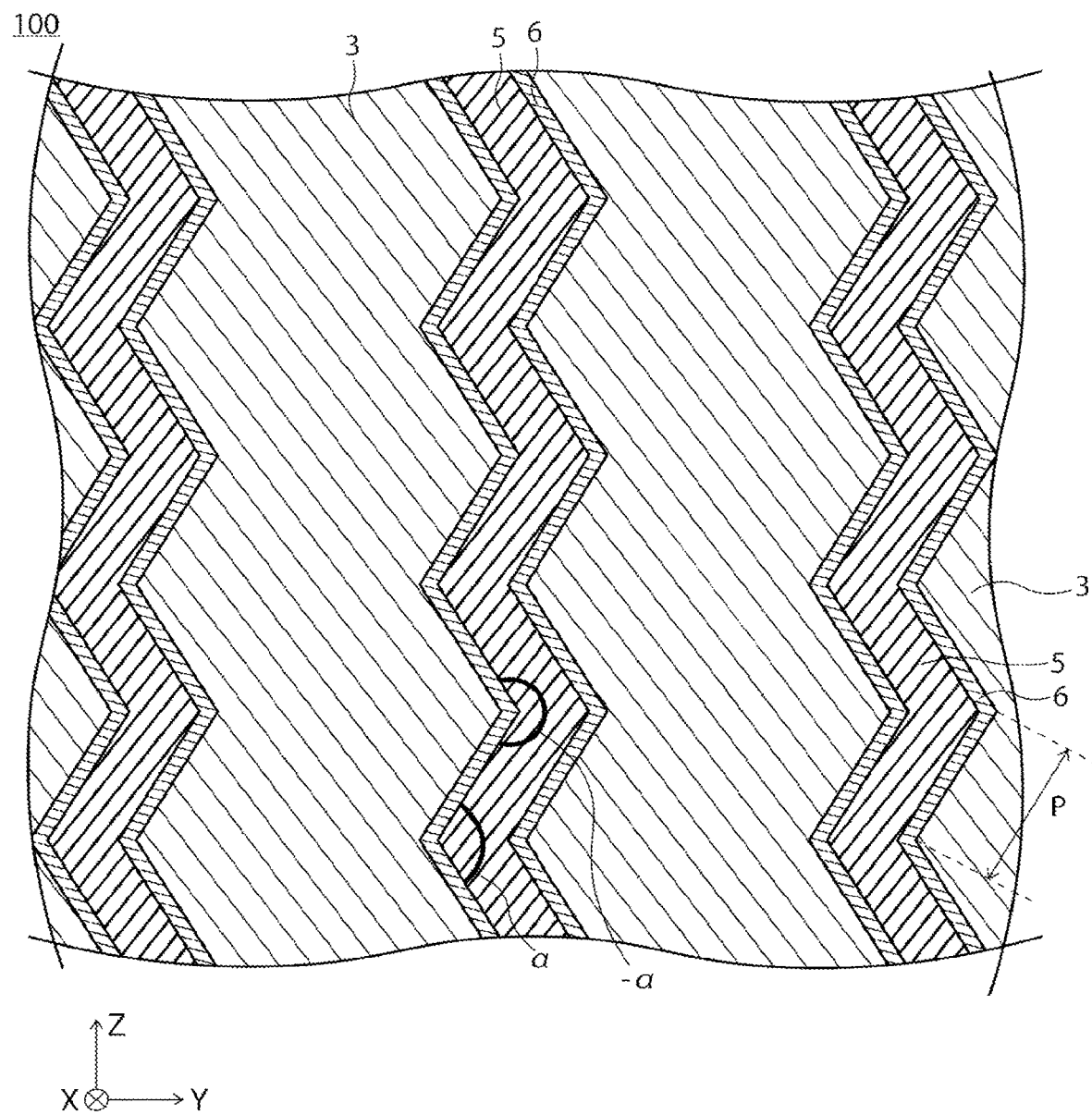
FIG. 2 is a sectional view illustrating the semiconductor device 100 in the embodiment.
Figure 3:
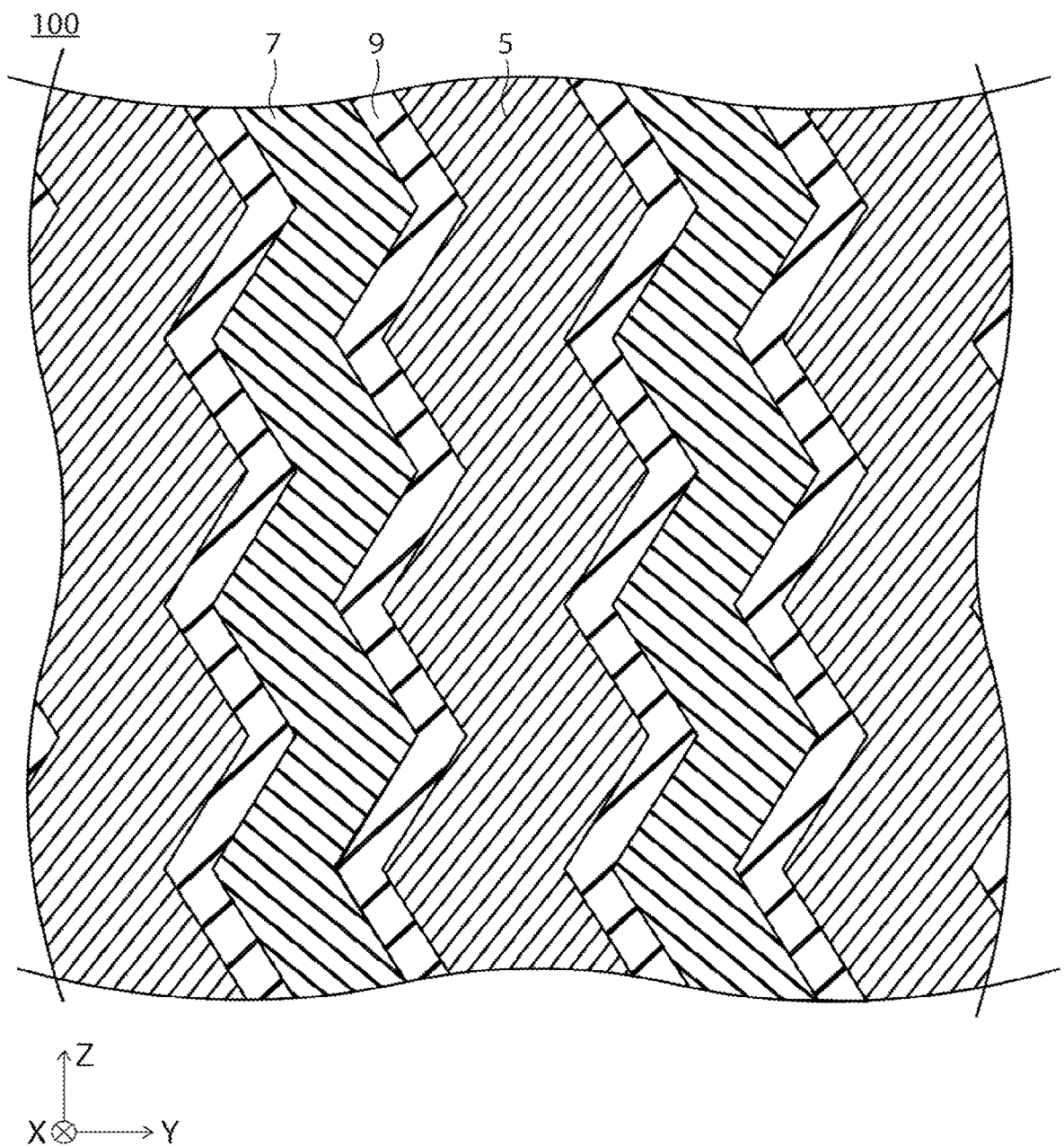
FIG. 3 is a sectional view illustrating the semiconductor device 100 in the embodiment.

FIG. 2 illustrates a sectional view taken along line A-A' of the semiconductor device 100 in the embodiment. FIG. 3 illustrates a sectional view taken along line B-B' of the semiconductor device 100 in the embodiment. The sectional views illustrated in FIGS. 2 and 3 illustrates a portion of the semiconductor device 100. The sectional views in FIGS. 1 to 3 illustrate the main portion of the semiconductor device 100.

The first nitride semiconductor layer (drain layer) 1 of the first conductive type is an n-type (n+ type) GaN layer, for example. The second nitride semiconductor layer 2 is provided on one surface of the drain layer 1. For example, the third electrode (drain electrode) 8 is provided on a surface of the drain layer 1 on an opposite side of a surface of the drain layer 1 on which the second nitride semiconductor layer 2 is provided. For example, titanium (Ti), nickel (Ni), gold (Au), silver (Ag), aluminum (Al), or alloys including the above metals are used for the drain electrode 8. The drain electrode 8 may be a stacked body of the above metals or alloys.

The second nitride semiconductor layer (drift layer) 2 of the first conductive type is an n-type (n-type) GaN layer, for example. The drift layer 2 is provided on the drain layer 1, and the drain layer 1 and the drift layer 2 are stacked in the first direction X. The drift layer 2 has a trench (gate trench) T1, and any trench does not penetrate the drift layer 2. The bottom of the trench T1 is located in the drift layer 2. The crystal plane of the drift layer 2, which faces the bottom of the trench T1 is preferably a C plane. The crystal plane may be not necessarily the C plane. The crystal plane may have a round shape, and the insulating film 6 at the bottom portion may not be formed along the bottom.

The third nitride semiconductor layer (channel layer) 3 of the second conductive type is, for example, a p-type GaN layer. The channel layer 3 is provided on the drift layer 2. The channel layer 3 and the drift layer 2 are stacked in the first direction X. More specifically, the channel layer 3 is selectively provided on the drift layer 2. The channel layer 3 is located to interpose the trench T1. The channel layer 3 is formed, for example, with p-type dopants such as Mg. The channel layer 3 is divided by the trench T1. A plurality of channel layers 3 are provided to interpose the trench T1 (first electrode 5 and first insulating film 6).

The channel layer 3 and the gate electrode 5 are more preferably bent in zigzag from a viewpoint of improving area efficiency. In the embodiment, the zigzag includes at least two bends or more, and bends in an opposite direction. If the layer 3 and the electrode 5 are bent in the same direction, the layer and the electrode are bent to draw a circumference, for example, in a hexagonal shape. Thus, the channel layer 3 and the gate electrode 5 have difficulty in extending in the third direction Z, and thus it is difficult to improve area efficiency.

If a structure in which the channel layer 3 and the gate electrode 5 extend to be bent in zigzag is employed, it is possible to increase the channel width in comparison to a case where the layer 3 and the electrode 5 are straight in one direction. Thus, this is preferable. If the channel width is increased, it is possible to increase the flowing current, and thus the area efficiency is improved. In a GaN MISFET in the related art, the channel layer 3 extends straight, or the channel layer is located to surround the hexagonal gate electrode. If the channel layer is formed to surround the hexagonal gate electrode, it may be possible to increase the channel width in comparison to the channel width of a straight channel layer. However, more improvement of the area efficiency is required for separating a hexagonal pattern to some extent.

If random bending is performed, the layout of an element becomes complicated, and it is difficult to improve the area efficiency. However, if the channel layer 3 and the gate electrode 5 are bent in zigzag, a direction in which the channel layer 3 and the gate electrode 5 extend is substantially straight, and thus it is easy to arrange a plurality of channel layers 3 and a plurality of gate electrodes 5 in parallel in stripes. Accordingly, it is easy to employ a structure causing the current capacity per area to increase. Since the structure in which the plurality of channel layers 3 and the plurality of gate electrodes 5 are alternately arranged in parallel in stripes is employed, it is possible to largely improve the area efficiency.

A bending interval P (length of the channel layer 3 in the channel width direction) is preferably equal to or greater than 10 μm. If the interval P is too short, the pattern becomes complicated. At both ends of the channel layer 3 in the third direction Z, for example, an element isolation region can be formed by increasing the resistance of the source layer 4. An end portion of the electrode can be formed on the element isolation region. From the viewpoint of improving the area efficiency, it is preferable that the bending interval P between the channel layer 3 and the gate electrode 5 is regular.

Figure 4:
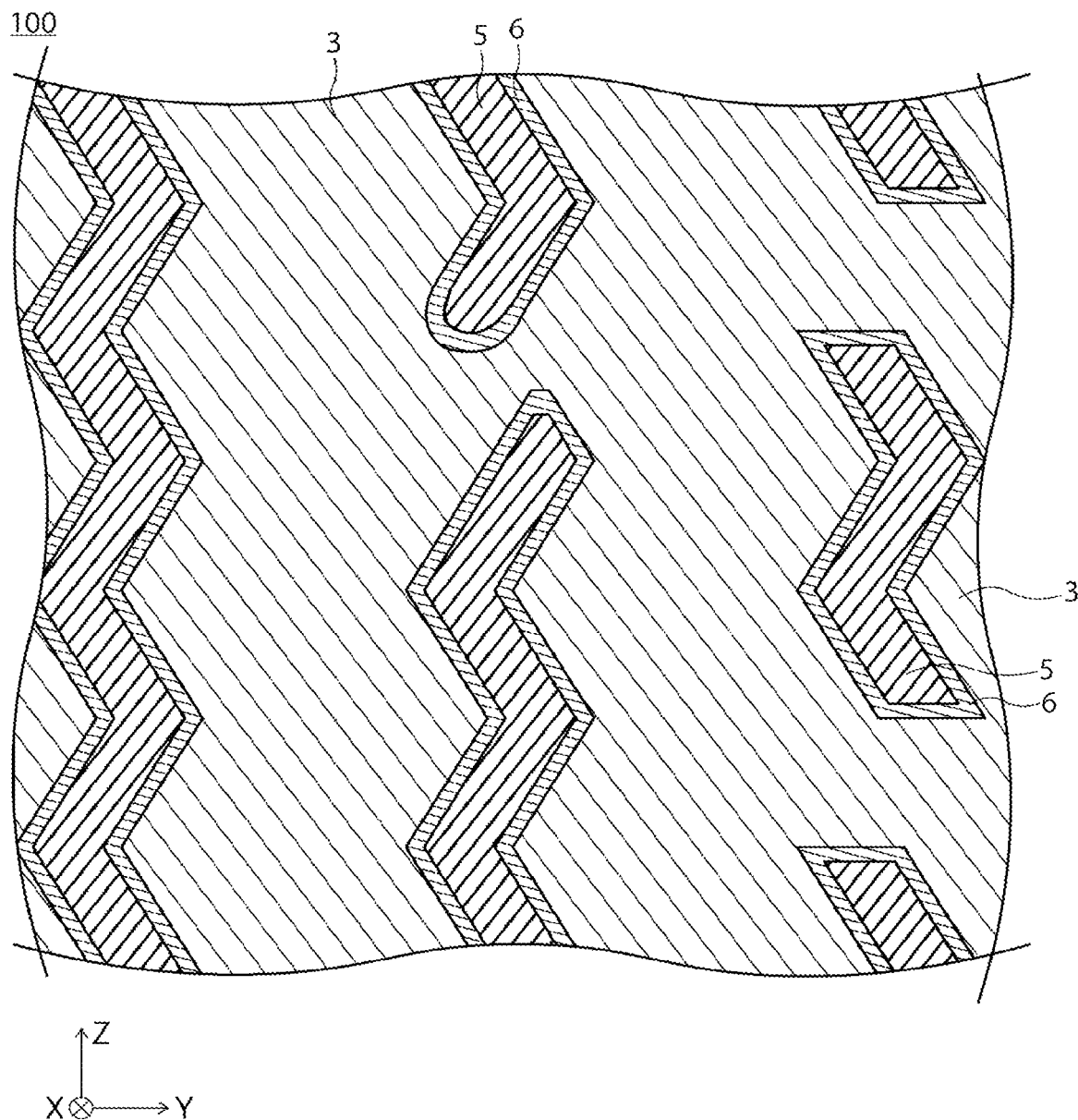
FIG. 4 is a sectional view illustrating the semiconductor device 100 in the embodiment.

FIG. 4 illustrates the sectional view taken along line A-A' of the semiconductor device 100 according to a modification example of the embodiment. As illustrated in the sectional view in FIG. 4, the channel layer 3 and the gate electrode 5 may be divided. That is, the end portions of the channel layer 3 and the gate electrode 5 may not be located at the end portions of the semiconductor device 100 in the third direction Z. Even though the channel layer 3 and the gate electrode 5 are interrupted in the third direction Z, as illustrated in the sectional view in FIG. 4, it is possible to improve the area efficiency. In the sectional view in FIG. 4, the channel layer 3 and the gate electrode 5 having different bending intervals P are provided. In a long bending interval P, a region in which it is not possible to form the channel layer 3 or the gate electrode 5 in the vicinity of the end portion in the first direction X may increase. However, in such a region, the channel layer 3 or the gate electrode 5 having a short bending interval P is formed, and thereby it is possible to Improve the area efficiency. The end portions of the channel layer 3 and the gate electrode 5, which have been divided, may be flat, be bent to draw a circumference at the same angle as the angle in the zigzag region, or be bent to draw a curved surface.

If the channel layer 3 and the gate electrode 5 are divided, the end portions of the channel layer 3 and the gate electrode 5 are located on the element isolation region. In order to improve the area efficiency even though this case is included, a ratio of the channel width of the channel layer bent in zigzag (the length of the channel layer 3 bent in zigzag/the length of the channel layer 3 including the portion which is not bent in zigzag) is preferably equal to or greater than 90°.

From a viewpoint of improving the area efficiency, it is more preferable that the bending interval of the channel layer 3 and the gate electrode 5 in the extension direction is regular. From a viewpoint of improving the area efficiency, it is more preferable that the bending angle of the channel layer 3 and the gate electrode 5 in the extension direction is regular. When a certain bending angle is set to α°, if a case where the bending angle is regular, the channel layer 3 and the gate electrode 5 are considered to be bent in the opposite direction when the next bending angle becomes −α°. That is, in a case where the bending angle is regular, when the n-th bending angle from one end of the third direction Z is α°, the n±odd-numbered bending angle is −α°, and the n±even-numbered bending angle is α except that the end portion in the third direction Z is bent. The bending angle α is, for example, 120°. Since GaN is a hexagonal system, for example, if α is 120°, it is possible to select an M-plane, an A-plane, or the like. The bending angle α may be 120±5°. Since both the bending interval and the bending angle are regular, the channel layer 3 and the gate electrode 5 are symmetrical except for the ends when folded at the center in the third direction Z. Except for the end portions of the channel layer 3 and the gate electrode 5, the channel layer 3 and the gate electrode 5 are preferably bent in opposite directions. Thus, the bending angle of the channel layer 3 and the gate electrode 5 in the extension direction is preferably 120±5° or −120±5°.

According to the first embodiment, in comparison to a case where the channel layer 3 is straight, in a case where the channel layer 3 is zigzag, the channel width is 1.2 times. Thus, it is possible to reduce a chip size in proportion to that in a case of the same Ron.

In addition, in a case where a hexagonal gate electrode is formed, an upper wiring layer for connecting each gate electrode and each source electrode is provided. However, if the zigzag configuration is employed, such a layered wiring is not required. Thus, it is possible to reduce wiring resistance by using a low resistance wiring for the gate electrode 5 and the source electrode 7.

If the length in bending in zigzag is too short, the effect of improving the area efficiency is small. Thus, 80% of the number of bends of the channel layer 3 and the gate electrode 5 is preferably bent in the opposite direction. More preferably, 90% or more thereof is bent in the opposite direction. From the viewpoint of suppressing variation in characteristics and maximizing the area efficiency, preferably, as illustrated in the sectional views in FIGS. 2 to 4, the channel layer 3 and the gate electrode 5 are bent in zigzag, and the bending interval and the bending angle are regular and are bent in the opposite direction.

The main crystal plane of the channel layer 3 bent in zigzag, which faces the first insulating film 6 is preferably configured by one equivalent crystal plane. In the channel layer 3, the vicinity of an interface with the first insulating film 6 is a channel region. The nitride semiconductor layer has characteristics varying depending on the crystal plane orientation. Thus, if the surface of the channel layer 3, which faces the trench T1 includes a crystal plane that is not equivalent, the dangling bonds on the surface of the channel layer 3, which faces the trench T1 vary. Unlike Si, GaN is a compound semiconductor of two types of elements being Ga and N. Thus, dangling bonds vary depending on the crystal plane orientation. Characteristics such as carrier concentration, interface state density with the insulating film, and mobility change by changing the crystal plane. For example, if two or more non-equivalent crystal planes are provided on the surface of the channel layer 3, which faces the trench, at a ratio of 1:1, regions having different characteristics are mixed in one semiconductor device, and the characteristics are not stable. Regarding this, if the main crystal plane of the channel layer 3 is configured one equivalent crystal plane, the characteristics are stabilized. In the semiconductor device 100 of the embodiment, a threshold voltage is stable, electric field concentration can be suppressed, and variation in on-resistance is reduced.

It is difficult to align crystallinity at the bent portion. Compared with a straight portion between the bent portions, the bent portion occupying the entire channel layer 3 has a small ratio, and the bent portion is not included in the main surface of the channel layer 3, which faces the first insulating film. In order to configure many crystal planes with one equivalent crystal plane, the length of the straight portion between the bent portions of the channel layer 3 is preferably 80% or more of the length of the channel layer 3 (including the bent portion).

If the portion between the bent portions is straight as illustrated in FIGS. 2 to 4, the main crystal plane of the channel layer 3 bent in zigzag, which faces the first insulating film 6, can be configured by one equivalent crystal plane. Meanwhile, if the channel layer 3 and the gate electrode 5 extend in a waveform, it is possible to improve the area efficiency. However, since the crystal plane in the channel region is not made by one equivalent crystal plane, characteristics such as carrier concentration, interface state density with the insulating film and mobility are not stable, and it is difficult to achieve high characteristics, even though the area efficiency is improved. Therefore, it is difficult to improve the characteristics of the entire semiconductor device. Thus, it is more preferable that the channel layer 3 and the gate electrode 5 are bent in zigzag, and that the main crystal plane in the channel region is configured by one equivalent crystal plane. For the above reason, it is preferable that 90% or more of the crystal plane of the channel layer 3 bent in zigzag, which faces the first insulating film 6 is configured by one equivalent crystal face.

The one equivalent crystal plane is not limited to main plane orientations such as the A plane, the M plane, or a semi-polar plane (R plane). In addition to these, a (1-101) plane, a (11-22) plane, a (20-21) plane, or the like is exemplified. In the A plane, a (11-20) plane, a (1-210) plane, and a (2-1-10) plane are equivalent crystal plane orientations. In the M plane, a (10-10) plane, a (1-100) plane, and a (0-110) plane are equivalent crystal plane orientations. The crystal plane orientation on the bottom side of the trench is not particularly limited because of having no influence on the channel characteristics.

Whether or not the main crystal plane of the channel layer 3, which faces the first insulating film 6 is configured by one equivalent crystal plane can be obtained by X-ray diffraction (XRD) or an electron diffraction method using a transmission electron microscope.

The crystal plane of the drift layer 2 located below the channel layer 3 is similar to that of the channel layer 3. Therefore, the main crystal plane of the drift layer 2, which faces the first insulating film 6 except for the bottom side of the trench T1 is preferably configured by one equivalent crystal plane. The main crystal plane of the drift layer 2, which faces the first insulating film 6 except for the bottom side of the trench T1 is preferably configured by one equivalent crystal plane, which is the same as the main crystal plane of the channel layer 3, which faces the first insulating film 6.

The fourth nitride semiconductor layer (source layer) 4 of the first conductive type is an n+ type GaN layer provided on the channel layer 3. The source layer 4 refers to, for example, a region formed by implanting n-type dopants into a portion of the channel layer 3. The source layer 4 is divided by the trench T1. A plurality of source layers 4 are provided to interpose the trench T1 (first electrode 5 and first insulating film 6). A second electrode (source electrode) 7 is provided on the source layer 4. It is preferable that the main crystal plane of the source layer 4, which faces the first insulating film 6 on the trench T1 side is also configured by one equivalent crystal plane. The main crystal plane of the source layer 4, which faces the first insulating film 6 on the trench T1 side is preferably one equivalent crystal plane, which is the same as the main crystal plane of the channel layer 3, which faces the first insulating film 6.

In the sectional view of FIG. 3, the source layer 4, the gate insulating film 6, and the source electrode 7 are regular and bent in zigzag, and extend to be meandered, in the same direction as the direction in which the channel layer 3 and the gate electrode 5 extend.

The first electrode (gate electrode) 5 and the first insulating film (gate insulating film) 6 are disposed in the trench T1. The trench T1 extends in the direction in which the drift layer 2 and the channel layer 3 are stacked, that is, in the first direction X from the source layer 4 toward the drift layer 2. The trench T1 is provided in the drift layer 2, the channel layer 3, and the source layer 4, and has the bottom located in the drift layer 2. The trench T1 penetrates the channel layer 3 and the source layer 4 and reaches the drift layer 2. A side surface of the trench T1 is in contact with the drift layer 2, the channel layer 3, and the source layer 4. The bottom surface of the trench T1 is in contact with the drift layer 2. The trench T1 extends in the third direction Z perpendicular to the first direction X. The third direction Z is preferably a direction perpendicular to an XY plane. The trench T1 (gate electrode 5 and gate insulating film 6) extends not in a straight line toward the third direction Z being a longitudinal direction while being bent.

The first electrode (gate electrode) 5 is an electrode provided via the first insulating film 6 provided in the trench T1. The gate electrode 5 extends in the third direction Z. A plurality of gate electrodes 5 are arranged side by side in the second direction Y. The channel layer 3 and the source layer 4 interpose the gate electrode 5 in the second direction Y. The gate electrode 5 is interposed by the gate insulating film 6 and interposed by the channel layer 3, in the second direction Y. The gate electrode 5 is configured with a conductive member of polysilicon, Ni, Ti, or TiN, for example. The upper portion of the gate electrode 5 is in contact with the first insulating film 9.

The gate electrode 5 is preferably bent and extends in a stripe, as illustrated in the sectional views in FIGS. 2 and 3. It is preferable that the channel layer 3 and the gate electrode 5 extend in the same direction, that is, the channel layer 3 and the gate electrode 5 are arranged in parallel. If the channel layer 3 and the gate electrode 5 are arranged in parallel, the width of the channel layer 3 is uniform, and the width of the gate electrode 5 is also uniform. Thus, it is possible to suppress variation in characteristics. A part or the entirety of the gate electrode 5 outside the trench T1 (for example, the upper side of the source layer 4) may be straight in the third direction Z without being bent.

The bending interval P of the channel layer 3 is preferably wider than the width W of the gate electrode 5. The bending interval P of the channel layer 3 is a distance from one bending start point to the next bending start point in the bent direction, as illustrated in the sectional view in FIG. 2. The width W of the gate electrode 5 is the distance of the gate electrode 5 in the second direction Y. In a case where the width of the gate electrode 5 is not uniform, the width of the gate electrode 5 at the half depth of the trench T1 is set to the width of the gate electrode 5. From the same viewpoint, it is more preferable that the bending interval P of the channel layer 3 is equal to or wider than 1.5 times the width W of the gate electrode 5 ($P \geq 1.5$ W). More preferably, the bending Interval P of the channel layer 3 is equal to or wider than two times ($P \geq 2$ W).

The first insulating film (gate insulating film) 6 is an insulating film disposed between the gate electrode 5 and the side surface of the trench T1. The gate insulating film 6 extends along the gate electrode 5 and the side surface of the trench T1 in the third direction Z. An inner side surface of the gate insulating film 6 is in contact with the gate electrode 5. An external side surface of the gate insulating film 6 is in contact with the drift layer 2, the channel layer 3, and the source layer 4 as the side surface of the trench T1. The lower surface of the gate insulating film 6 is in contact with the drift layer 2. The upper surface of the gate insulating film 6 is in contact with the gate electrode 5 or the second insulating film 9. The gate insulating film 6 is configured, for example, by an insulating member such as a silicon oxide ($SiO_2$) film or a silicon nitride (SiN) film. The gate insulating film 6 may be a laminated film.

The second electrode (source electrode) 7 is a source electrode of the semiconductor device 100, which is connected to the source layer 4. The source electrode 7 is provided on the source layer 4. For example, a metal film made of titanium (Ti), nickel (Ni), gold (Au), silver (Ag), or aluminum (Al), or an alloy film including the above metals are used as the source electrode 7. The source electrode 7 may be a stacked body of the above metals or alloys.

The second insulating film (interlayer insulating film) 9 is an insulating film disposed at the upper portion of the trench T1 and the upper portion of the source layer 4. The lower surface of the interlayer insulating film 9 is in contact with the gate electrode 5, the gate insulating film 6, or the like. A portion of the lower surface of the interlayer insulating film 9 outside the trench T1 is in contact with the source layer 4. The interlayer insulating film 9 is configured by an insulating member such as a silicon oxide ($SiO_2$) film.

In other words, in the embodiment, the semiconductor device 100 includes the first nitride semiconductor layer (drain layer) 1 of the first conductive type, the second nitride semiconductor layer (drift layer) 2 which is the first conductive type and is provided on the first nitride semiconductor layer 1, the third nitride semiconductor layer (channel layer) 3 which is the second conductive type and is provided on the second nitride semiconductor layer 2, the fourth nitride semiconductor layer (source layer) 4 which is the first conductive type and is provided on the third nitride semiconductor layer 3, the first electrode (gate electrode) 5 which is provided via the first insulating film (gate insulating film) 6, has the bottom located on the second nitride semiconductor layer, and has the side surface facing the second nitride semiconductor layer 2, the third nitride semiconductor layer 3, and the fourth nitride semiconductor layer 4, and the first insulating film (gate insulating film) 6 interposing the first electrode 5.

Second Embodiment

Figure 5:
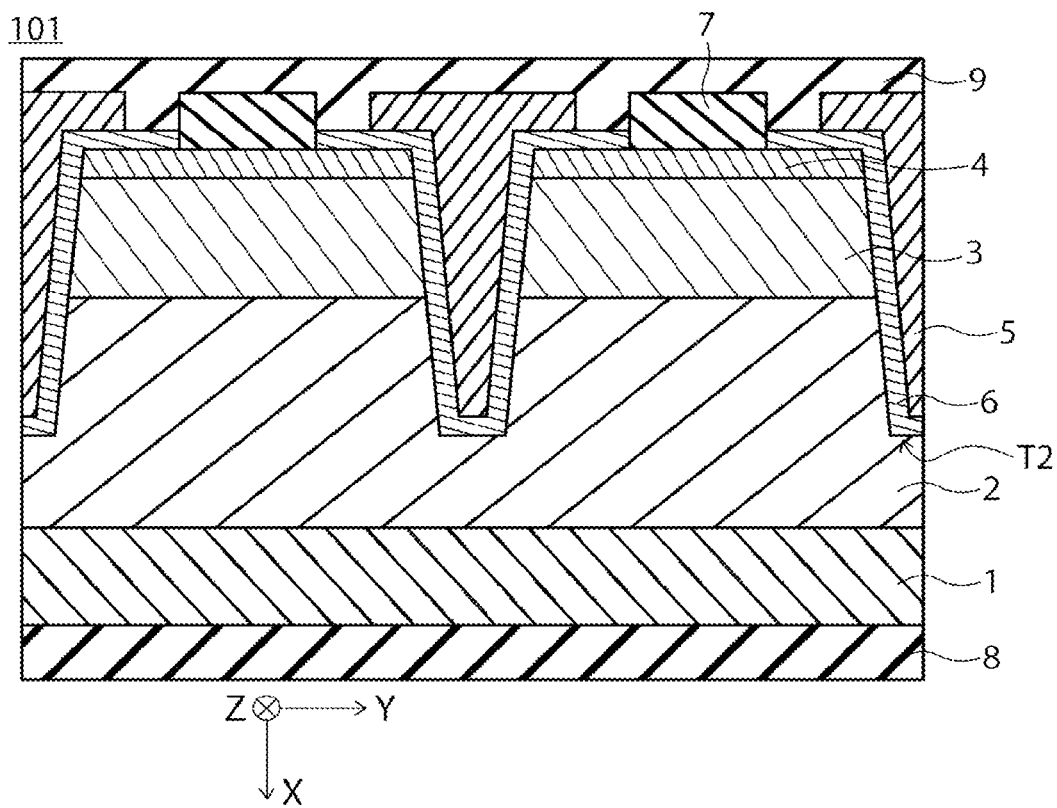
FIG. 5 is a sectional view illustrating a semiconductor device 101 according to the embodiment.
Figure 6:
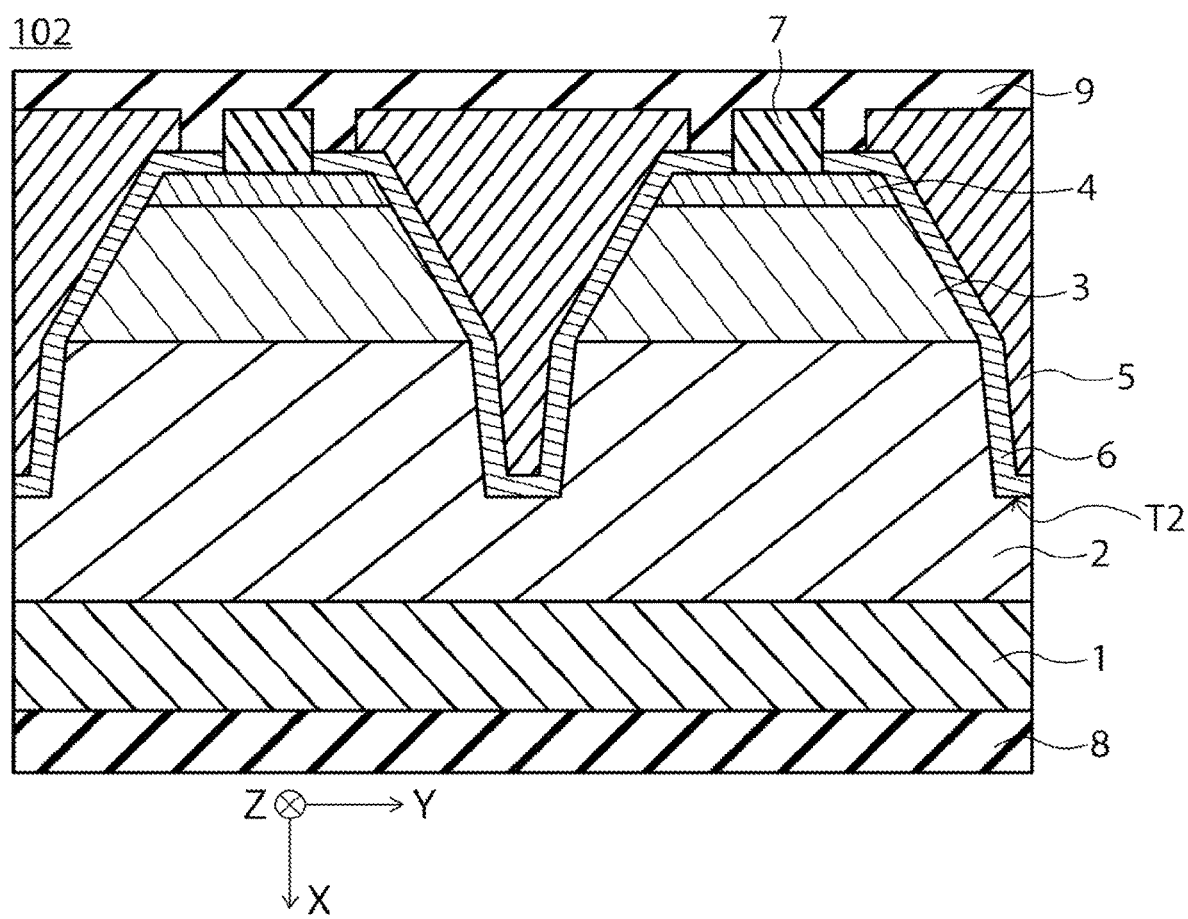
FIG. 6 is a sectional view illustrating a semiconductor device 102 according to the embodiment.

A second embodiment relates to a semiconductor device. FIGS. 5 and 6 are sectional views illustrating semiconductor devices 101 and 102 according to a second embodiment. The sectional view in FIG. 5 corresponds to the sectional view in FIG. 1. The semiconductor devices 101 and 102 of the second embodiment are similar to the semiconductor device 100 in the first embodiment except that the semiconductor devices 101 and 102 are tapered toward the bottom of a trench T2.

Since the trench T2 is tapered, the gate electrode 5 is also tapered. The gate insulating film 6 is also provided to correspond to the shapes of the trench T2 and the gate electrode 5. It is possible to select the plane orientation of the main crystal plane of the channel layer 3, which faces the gate insulating film, by tapering the trench T2. For example, the (101-1) plane, the (10-12) plane, and the (11-22) plane are preferably used as the plane orientation of the main crystal plane of the channel layer 3, which faces the gate insulating film. The plane orientation of the main crystal plane of the channel layer 3, which faces the gate insulating film 6 may be formed on another plane. Since the dangling bond of the drift layer 2 hardly has an influence on the characteristics of the channel region, the crystal plane of the drift layer 2 on the surface facing the trench T2 may be one equivalent crystal plane or a random crystal plane. The tapered shape of the gate electrode 5 in the channel layer 3 and the drift layer 2 may have the same angle or a different angle. As illustrated in FIG. 6, the gate electrode 5 in the drift layer 2 region may be tapered at a steeper angle than the gate electrode 5 in the channel layer 3 region. The bottom of the trench T2 located in the drift layer 2 may be round at the tip instead of being flat. In a case where the angles of the trench T2 in the drift layer 2 and the channel layer 3 are different as illustrated in FIG. 5, the dangling bond on the surface of the channel layer 3, which faces the trench T2 is different from the dangling bond on the surface of the drift layer 2, which faces the trench T2.

Third Embodiment

Figure 7:
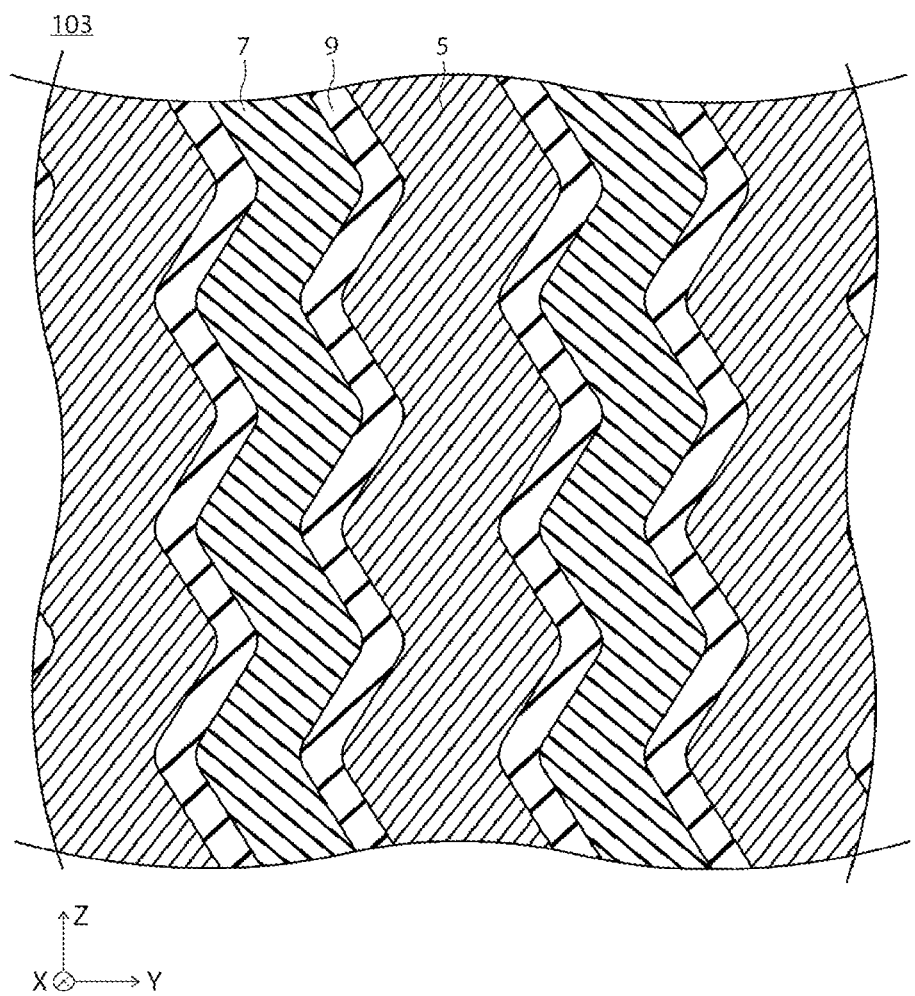
FIG. 7 is a sectional view illustrating a semiconductor device 103 according to the embodiment.

A third embodiment relates to a semiconductor device. FIG. 7 is a sectional view illustrating a semiconductor device 103 according to the third embodiment. The sectional view in FIG. 7 corresponds to the sectional view in FIG. 3. The semiconductor device 103 in the third embodiment is similar to the semiconductor device 100 in the first embodiment except that the bent portions of the channel layer 3 and the gate electrode 5 include a curved surface. In the third embodiment, it is possible to employ a structure in which the semiconductor device 103 is tapered toward the bottom of the trench T2 as in the second embodiment.

For example, in the semiconductor device 100 illustrated in the sectional view in FIG. 3, which is taken along line B-B' in FIG. 1, the bent portions of the gate electrode 5 and the source electrode 7 are corners, but may include a curved surface as in the sectional view in FIG. 7. Similarly, the bent portions of the channel layer 3 and the gate electrode 5 may be curved surfaces in the section taken along line A-A' in FIG. 1. If the bent portion is a curved surface, the crystal plane at the bent portion is not made by one equivalent crystal plane. However, the portion other than the bent portion (main crystal plane) is one equivalent crystal plane. The distance P at the portion other than the bent portion (main crystal plane) is longer than that at the bent portion such that the length ratio is equal to or greater than 10 times, and preferably equal to or greater than 20 times. Thus, it is possible to substantially ignore the influence of the semiconductor device 103 on the characteristics, which is caused when the crystal plane at the bent portion is not equivalent to the crystal plane at the portion other than the bent portion. Even in a case where it is difficult to control the crystallinity of the bent portion, it is possible to provide the semiconductor device 103 having high characteristic stability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first nitride semiconductor layer of a first conductive type;
a second nitride semiconductor layer which is the first conductive type and is provided on the first nitride semiconductor layer;
a third nitride semiconductor layer which is a second conductive type and is provided on the second nitride semiconductor layer;
a fourth nitride semiconductor layer which is the first conductive type and is provided on the third nitride semiconductor layer;
a first electrode provided in a trench provided in the second nitride semiconductor layer, the third nitride semiconductor layer, and the fourth nitride semiconductor layer, via a first insulating film; and
a second electrode provided on the fourth nitride semiconductor layer,
wherein the third nitride semiconductor layer, the first electrode, the fourth nitride semiconductor layer, the first insulating film, and the second electrode extend in a direction perpendicular to a direction in which the first nitride semiconductor layer and the second nitride semiconductor layer are stacked and are bent in zigzag.

2. The semiconductor device according to claim 1,
wherein a plurality of third nitride semiconductor layers is provided to interpose the first electrode between the third nitride semiconductor layers, and
the third nitride semiconductor layer and the first electrode extend in the direction perpendicular to the direction in which the first nitride semiconductor layer and the second nitride semiconductor layer are stacked, and extend in stripes in the same direction.

3. The semiconductor device according to claim 1,
wherein a main crystal plane of the third nitride semiconductor layer, which faces the first insulating film is configured by one equivalent crystal plane.

4. The semiconductor device according to claim 1,
wherein the trench is tapered toward a bottom.

5. The semiconductor device according to claim 1,
wherein the bent portion of the third nitride semiconductor layer and the first electrode includes a curved surface.

6. The semiconductor device according to claim 1,
wherein a bending interval between the third nitride semiconductor layer and the first electrode is regular, and
bending angles of the third nitride semiconductor layer and the first electrode are regular.

7. The semiconductor device according to claim 1,
wherein a length of the third nitride semiconductor layer in a channel width direction is equal to or greater than 10 μm.

8. The semiconductor device according to claim 1, wherein bending angles of the third nitride semiconductor layer and the first electrode are 120±5° or −120±5°.

9. The semiconductor device according to claim 1, further comprising:
wherein the fourth nitride semiconductor layer, the first insulating film, and the second electrode extend to regularly bend in zigzag in the same direction as a direction in which the third nitride semiconductor layer and the first electrode extend.

10. The semiconductor device according to claim 1, wherein a portion of the third nitride semiconductor layer and the first electrode is non-continuous in the extending direction.

11. The semiconductor device according to claim 1, the third nitride semiconductor layer and the first electrode are arranged in parallel.

* * * * *